United States Patent
Tanimoto et al.

[11] Patent Number: 5,981,381
[45] Date of Patent: Nov. 9, 1999

[54] METHOD OF MANUFACTURING A SEMICONDUCTOR MEMORY DEVICE

[75] Inventors: Masao Tanimoto, Yokohama; Seiichi Mori, Tokyo, both of Japan

[73] Assignee: Kabushiki Kaisha Toshiba, Kawasaki, Japan

[21] Appl. No.: 08/814,887

[22] Filed: Mar. 12, 1997

[30] Foreign Application Priority Data

Mar. 14, 1996 [JP] Japan .................................. 8-056612

[51] Int. Cl.⁶ .................... H01L 21/4763; H01L 21/336; H01L 21/302
[52] U.S. Cl. ........................... 438/645; 438/257; 438/706
[58] Field of Search .................. 438/257, 645, 438/706

[56] References Cited

U.S. PATENT DOCUMENTS

| | | | |
|---|---|---|---|
| 5,150,178 | 9/1992 | Mori | 357/23.5 |
| 5,595,924 | 1/1997 | Yuan et al. | 437/43 |
| 5,707,897 | 1/1998 | Lee et al. | 438/257 |
| 5,731,237 | 3/1998 | Sato | 438/257 |

FOREIGN PATENT DOCUMENTS 7-245350  9/1995  Japan .

OTHER PUBLICATIONS

Wolf, S.;Silicon Processing for the VLSI Era, vol. 2; Lattice Press, Sunset Beach, Ca.; pp.222–236, 1990.

*Primary Examiner*—John F. Niebling
*Assistant Examiner*—Neal Berezny
*Attorney, Agent, or Firm*—Banner & Witcoff, Ltd.

[57] ABSTRACT

In a semiconductor memory device, first insulating films are formed on a semiconductor substrate. Element isolating layers are formed on the semiconductor substrate for isolating element forming regions set at regular intervals in the semiconductor substrate, such that the upper surface of the element isolating layers are located at a higher level than the upper surface of the semiconductor substrate. First conductive layers are formed at regular intervals on the first insulating films. A second insulating film is formed on the element isolating layers and the first conductive layer. A second conductive layer, which has a lower surface with irregularities corresponding to the configurations of the element isolating layers and the first conductive layer, and a flat upper surface irrespective of the configurations of the element isolating films and the first conductive layer, is formed on the second insulating film. A wiring layer, which includes a high-melting-point metal, is formed on the second conductive layer.

26 Claims, 4 Drawing Sheets

METHOD OF MANUFACTURING A SEMICONDUCTOR MEMORY DEVICE

BACKGROUND OF THE INVENTION

This invention relates to a semiconductor memory device, such as an EEPROM or an EPROM, which has two or more gate electrode layers, and a method for manufacturing the device. More particularly, the invention relates to a semiconductor device which employs a metal of a high melting point and a low resistance or a silicide layer containing the metal as the material of a second electrode layer, so as to minimize a signal delay due to the long length of the gate electrode layer, and also to a method for manufacturing the device.

A method for manufacturing a memory cell with two gate layers employed, for example, in an EEPROM, in a process as shown in FIGS. 1A to 1C is well known.

Referring first to FIG. 1A, element isolating oxide layers 302 as element isolating regions are formed on surface portions of e.g., a p-type silicon substrate 301, then a first gate oxide film 303 is formed on that surface portion of the substrate which is located between the element isolating oxide layers 302, and a first polysilicon layer 304 which will constitute a first gate electrode (a floating gate) is formed on the overall surface of the resultant structure.

Referring then to FIG. 1B, the polysilicon layer 304 is patterned to form a floating gate 305, and subjected to a heat treatment, and then an insulating film 306 is deposited by the known LPCVD method.

Subsequently, as shown in FIG. 1C, a second polysilicon layer 307 which will constitute a second gate electrode (a control gate) is deposited on the overall surface of the structure, and further a tungsten silicide layer 308, for example, is deposited thereon.

FIG. 2A is a sectional view, taken along lines II—II of FIG. 1C. As is shown in FIG. 2A, the tungsten silicide layer 308, the second polysilicon layer 307, the insulating film 306, and the floating gate 305 are patterned to form a stacked gate 401 comprising the control gate and the completely isolated floating gate 305.

Subsequently, as is shown in FIG. 2B, an oxide film 311 is formed, and then ions of an n-type impurity are injected into the substrate 301, using the stacked gate 401 as a mask. The injected ions are activated to form n$^+$-type source and drain regions 403 and 404, thereby depositing an oxide film by the LPCVD, forming a contact hole and an Al wire layer. Thus, the EEPROM memory is completed.

The above-described semiconductor manufacturing method has the following drawbacks:

Since in the method, the first polysilicon layer 304 is formed on the overall surface of the structure and then patterned to form the floating gate 305, a trench 309 which divides the floating gate 305 is formed in the gate 305 at a location corresponding to each element isolating oxide layer 302, and the insulating film 306 is formed on the divided floating gate portions 305 and on that portion of the element isolating oxide layer 302 at which the trench 309 is formed.

Thereafter, a control gate of a double-layer structure which consists of the second polysilicon layer 307 and the high-melting-point metal layer (or the silicide layer containing the metal) 308 is formed in order to reduce the resistance of the control gate and increase the operational speed of the element.

The upper surface of the second polysilicon film 307 has irregularities corresponding to those of the underlayer structure which are formed because of the trenches 309 and the element isolating layer 302. The high-melting-point metal or silicide layer 308 deposited on the polysilicon layer 307 accordingly has irregularities at its upper surface corresponding to the irregularities of the underlayer structure.

When the resultant structure is heated in a later process, stress concentration may well occur at concave portions of the upper surface of the resultant structure, in particular, above the trenches 309. As a result, a crack 310 (see FIG. 1C) may occur in the silicide layer, thereby increasing the resistance of the silicide layer, or breaking the same.

Moreover, there is a case where a method described below will be employed at the time of patterning the control gate layers 307 and 308, the insulating film 306 and the floating gate 305, in order to prevent the so-called micro-loading effect (which indicates a state wherein a very fine pattern is hard to form by etching, which state may well occur in a recent highly-refining process). In this method, in place of performing etching using a conventional resist layer as a mask, an oxide film and a nitride film are deposited on a second electrode layer which will be patterned to form a control gate, and are patterned using a conventional resist layer. Thereafter, the resist layer is removed and the patterned oxide and nitride films are used as masks.

In the case of using this method, that part of the masks, which enters cracks caused due to the irregularities of the trenches 309, is hard to etch at the time of patterning. As a result, part of the mask materials will be left in the form of columns at the irregularities, and accordingly part of the material of the gate electrode will be left as a residue at the irregularities in the next etching treatment for forming the gate electrode. This means that the resultant memory cell cannot operate normally.

FIG. 3 is a plan view of a memory cell array. In FIG. 3, hatched portions 501 indicate cell regions of a semiconductor substrate provided with control gate electrodes 503 of a band shape and element isolating regions 502.

Reference numeral 504 denotes a conductive layer which cannot be removed by etching since part of the mask material is left as a residue in a crack formed in the element isolating regions 502. The conductive layer 504 makes the gates of adjacent memory cells shortcircuited.

Further, to meet the development of refining techniques, there is a case using a photoetching method for forming a fine resist pattern, where an antireflection film is provided below a resist layer to restrain reflection of light from an underlayer and enhance the resolution of the resist layer. If, in this case, however, the antireflection film has a high fluidity, the thickness of the film may well be varied between portions thereof because of steps formed of the underlayer, with the result that the film may be overetched or incompletely etched with an etching residue left.

In addition, to make, as flat as possible, the upper surfaces of those portions of the second polysilicon layer 307, which are located over the trenches 309 between the floating gates 305, U.S. Pat. No. 5,150,178, for example, discloses a method for depositing the second polysilicon layer 307 by a thickness equal to half or more the width of the trench 309, and a method for etching back the second polysilicon layer 307 by the RIE method.

Although, however, the above-mentioned methods can prevent the layer 307 from having a great step in the trench 309 if the floating gate 305 has a thin thickness, steps will be formed still between the trench 309 formed at a location corresponding to the element isolating region 302, the floating gate 305 and the insulating film 306. Thus, the polysilicon layer 307 is influenced by the irregularities of the underlayer between them. Accordingly, there is still a possibility of occurrence of a crack in the high-melting-point metal or silicide layer 308 deposited on the second polysilicon layer 307, because of the irregularities of the underlayer.

As described above, in the conventional memory cell of a multilayer gate structure, the drawback that a crack will occur in the uppermost gate layer because of a step formed of the underlayer still remains.

BRIEF SUMMARY OF THE INVENTION

This invention has been developed to eliminate the above-described drawback, and aims to provide a semiconductor memory device having a memory cell array of a gate electrode structure free from cracks, where the gate electrode structure comprises, for example, two or more layers and its uppermost layer is made of polysilicon and one of a high-melting-point metal and a silicide containing the metal.

According to an aspect of the invention, there is provided a semiconductor memory device comprising:

a semiconductor substrate;

first insulating films formed on the semiconductor substrate;

element isolating layers formed on the semiconductor substrate for isolating element forming regions set at regular intervals in the semiconductor substrate, the upper surface of the element isolating layers being located at a higher level than the upper surface of the semiconductor substrate;

first conductive layers formed at regular intervals on the first insulating films;

a second insulating film formed on the element isolating films and the first conductive layers;

a second conductive layer formed on the second insulating film, having a lower surface with irregularities corresponding to the configurations of the element isolating layers and the first conductive layers, and having a flat upper surface irrespective of the configurations of the element isolating layers and the first conductive layers; and a wiring layer formed on the second conductive layer and containing a high-melting-point metal.

According to another aspect of the invention, there is provided a method of manufacturing a semiconductor memory device, comprising the steps of:

forming a first insulating film on the semiconductor substrate;

forming element isolating layers on the semiconductor substrate for isolating element forming regions with regular intervals in the semiconductor substrate, the upper surface of the element isolating layers being located at a higher level than the upper surface of the semiconductor substrate;

forming first conductive layers with regular intervals on the first insulating film;

forming a second insulating film on the element isolating layers and the first conductive layers;

forming a second conductive layer on the second insulating film such that the second conductive layer has a flat upper surface irrespective of the configurations of the element isolating layers and the first conductive layers; and forming a high-melting-point metal layer on the flattened second conductive layer.

According to the semiconductor device constructed as above and the method of manufacturing the device, a second conductive layer of a flat upper surface (i.e., the upper surface of the second conductive layer is at substantially the same level above the element forming regions and on the element isolating layers) is provided irrespective of the underlayer structure, even if the underlayer structure has steps formed of the floating gate and the insulating film and located at each trench because of the fact that the upper surfaces of the element forming regions and the element isolating layers are at different levels. As a result, occurrence of a crack in the high-melting-point metal layer or the silicide layer containing the high-melting-point metal, which may be caused by the steps of the underlayer structure, is prevented.

Furthermore, since the high-melting-point metal layer or the silicide layer has a flat surface irrespective of the trenches in the underlayer, no crack will occur in a heat treatment performed later, for example, at the time of depositing a mask material or of forming an oxide film, with the result that occurrence of a residue and a reduction in the resistance of the gate electrode can be prevented, and the margin of lithography can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention

DETAILED DESCRIPTION OF THE INVENTION

A semiconductor memory device and a method for manufacturing the device, according to the embodiment of the invention, will now be described with reference to FIGS. 4A to 4C and FIGS. 5A to 5D.

Figure 1A:
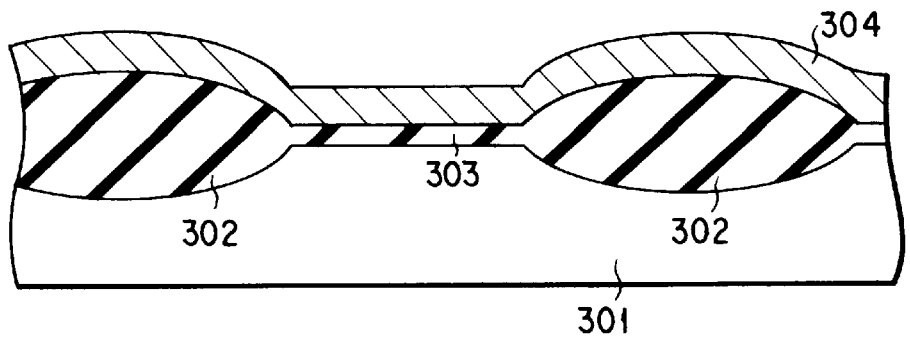
FIGS. 1A to 1C are sectional views, showing a process for manufacturing a conventional EEPROM.
Figure 1B:
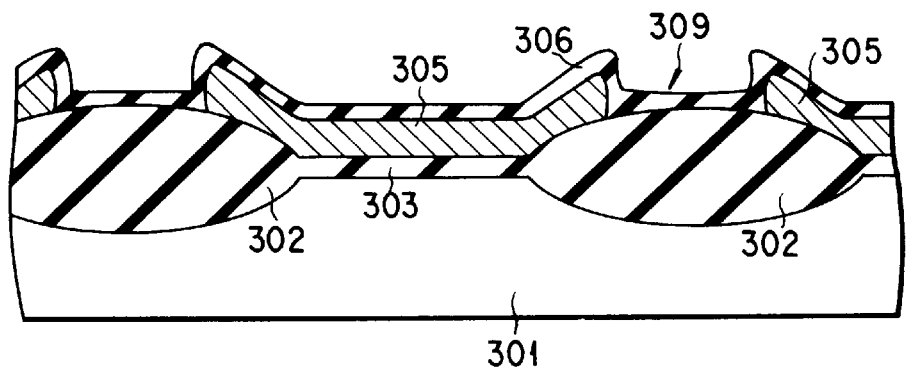
Figure 1C:
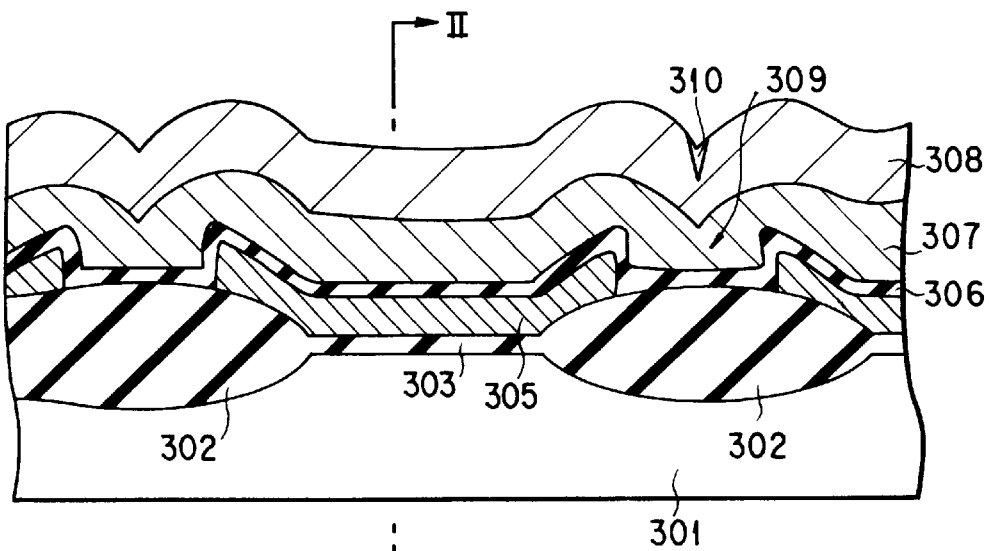
Figure 2A:
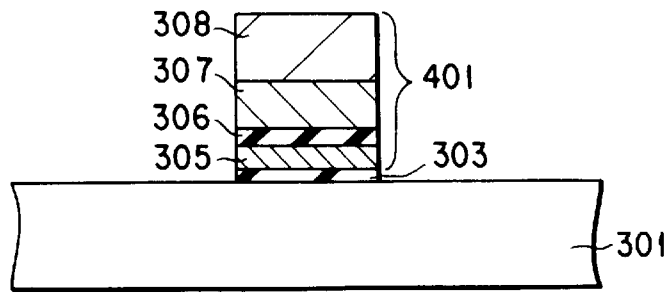
FIGS. 2A and 2B are sectional views, taken along lines II—II of FIG. 1C, and partially showing the manufacturing process.
Figure 2B:
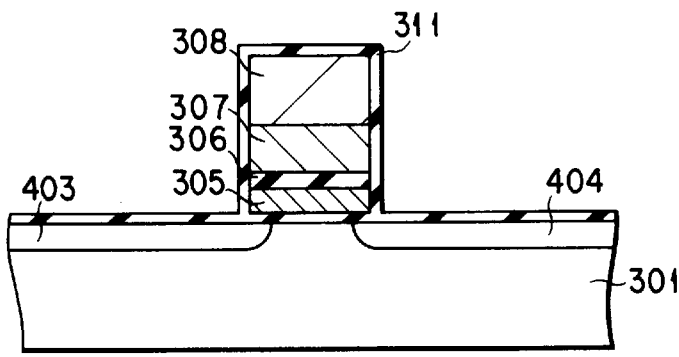
Figure 3:
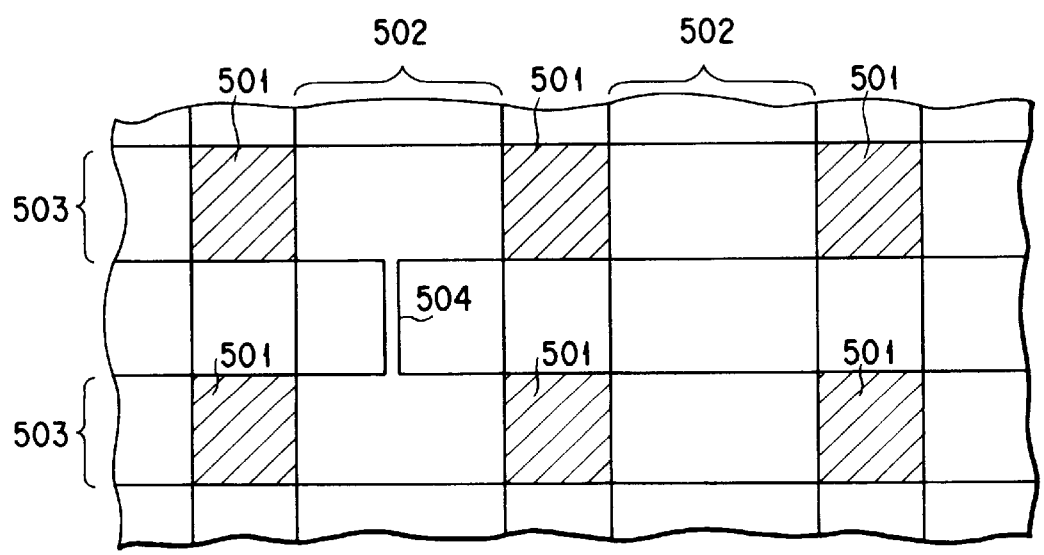
FIG. 3 is a plan view of the conventional memory cell array.
Figure 4A:
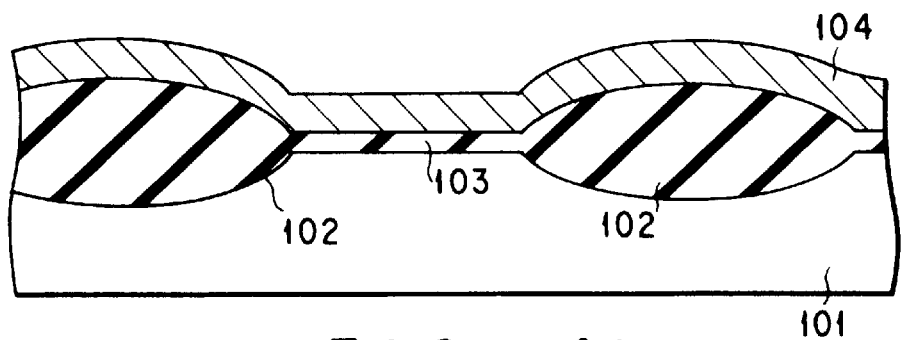
FIGS. 4A to 4C are sectional views, partially showing a process for manufacturing the cell array of an EEPROM according to the present invention.

Referring first to FIG. 4A, element isolating oxide films 102 with a thickness of about 300 nm are formed as element isolating regions on surface portions of a p-type silicon substrate 101, then a first gate oxide film 103 with a thickness of about 10 nm is formed, by a known method, on that surface portion of the substrate which is located between the element isolating oxide films 102, and a first polysilicon layer 104 with a thickness of e.g. 100 nm which will constitute a first gate electrode (a floating gate) is formed on the overall surface of the first gate oxide film 103.

Figure 4B:
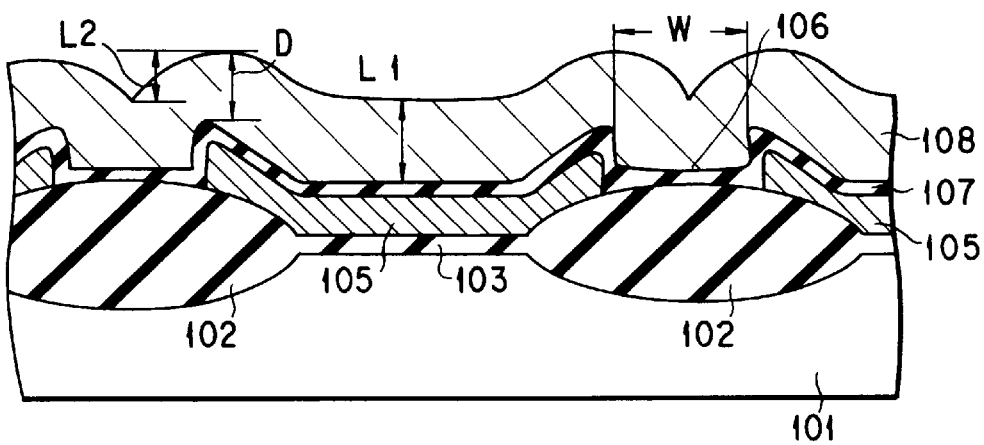

Referring then to FIG. 4B, the polysilicon layer 104 is subjected to photolithography and etching, where those portions of the layer 104 which have a width of 4 μm are eliminated, thereby forming polysilicon strips 105 which will finally constitute floating gates.

At this time, in order to insulate the first polysilicon layers which will constitute a first gate layer, from a second polysilicon layer 108 which constitutes a second gate layer, an insulating film 107 is formed. At this time, the areas in which the layer 104 is etched constitute trenches 106. Further, an upper surface portion of each first polysilicon strip 105 is thermally oxidized by a depth of 6 nm, and a silicon nitride film with a thickness of 6 nm and a silicon oxide film with a thickness of 6 nm are deposited in this order on the resultant structure by the LPCVD method, thereby forming the insulating film 107 (FIG. 4B).

Subsequently, the polysilicon layer 108 which will constitutes a second gate electrode (a control gate) is deposited by a thickness of e.g., 250 nm. The layer 108 is then etched for about 150 sec. by the known CDE method, using a gas mixture of $CF_4$ and oxygen. As a result, those convex portions of the layer 108 which are located on convex portions of the underlayer are selectively quickly etched, and accordingly a polysilicon layer 109 with a flat surface is formed irrespective of the irregularities of the underlayer.

Figure 4C:
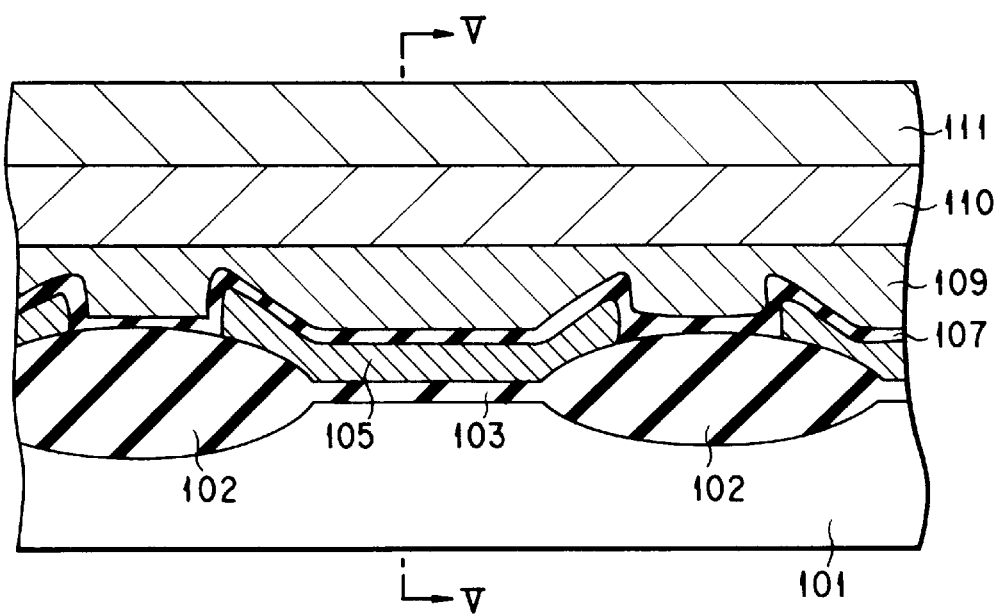

Thereafter, a tungsten silicide layer 110 with a thickness of 20 nm is deposited on the polysilicon layer 109 by sputtering, and then a silicon oxide film 111 with a thickness of 300 nm which will be used as an etching mask is deposited by the LPCVD (FIG. 4C).

Referring then to FIGS. 5A to 5D taken along lines V—V of FIG. 4C, a method for manufacturing the semiconductor memory device of the invention will be succeedingly described.

Figure 5A:
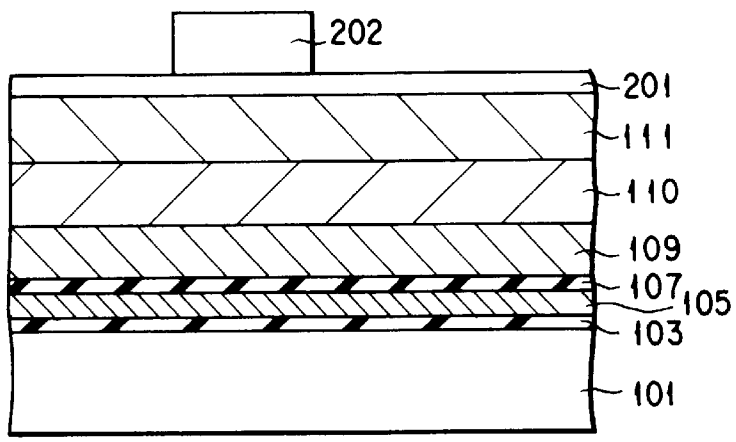
FIGS. 5A to 5D are sectional views, taken along lines V—V of FIG. 4C, and partially showing the manufacturing process.

An antireflection film 201 for preventing reflection of light from the underlayer at the time of lithography is provided on the silicon oxide film 111, thereby patterning a resist layer by lithography (FIG. 5A).

Figure 5B:
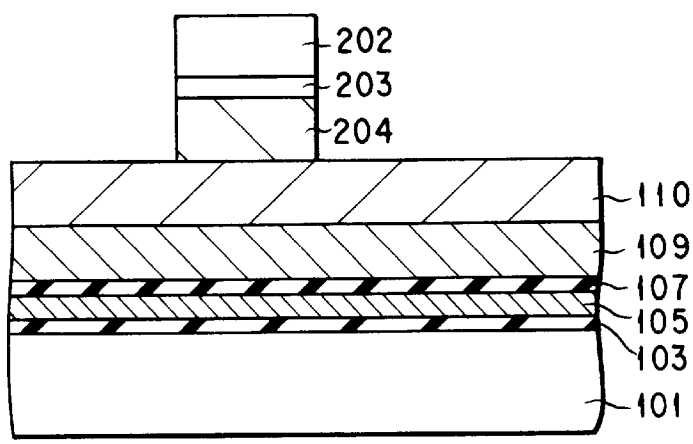

The antireflection film 201 and the silicon oxide film 111 are etched using the patterned resist layer 202 as a mask (FIG. 5B).

Figure 5C:
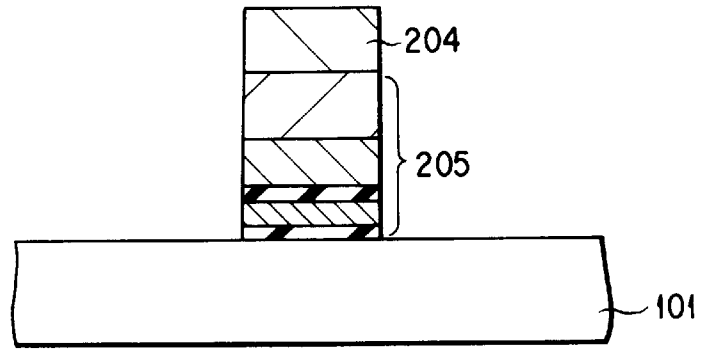

After the patterned resist layer 202 and patterned antireflection film 203 are removed, the tungsten silicide layer 110, the second polysilicon layer 109, the insulating film 107 and the floating gate 105 are etched using the patterned silicon oxide film 204 as a mask, thereby forming a stucked gate electrode 205 (FIG. 5C).

Figure 5D:
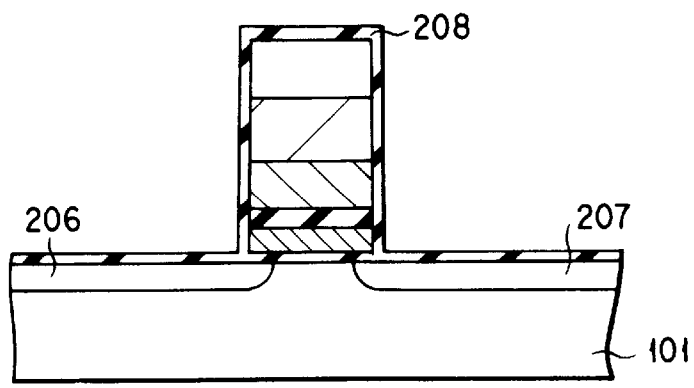

Subsequently, a source diffusion layer 206 and a drain diffusion layer 207 are formed by ion injection, and the resultant structure is oxidized to form an oxide film 208 (FIG. 5D).

Moreover, an interlayer insulating film (not shown) is formed, thereby forming contacts, metal wiring, etc. Thus, the EEPROM (Electrically Erasable and Programable ROM) memory cell is completed.

In the above-described manufacturing method, to flatten the surface of the polysilicon layer 108, the CDE is performed using a gas mixture of $CF_4$ and oxygen after the deposition of the polysilicon layer 108 which constitutes the second gate electrode layer.

Therefore, the upper surface of a tungsten silicide layer 110 deposited on the polysilicon layer 109 which is obtained by flattening the upper surface of the polysilicon layer 108 is also flat.

Flattening the surface of the upper gate electrode layer can prevent concentration of stress during a heat treatment, and accordingly prevent occurrence of a crack in the tungsten silicide layer.

As stated in the section "Background of the Invention", the crack will not only increase the resistance of the control gate, but also cause a residue during processing of the control gate. The above-described manufacturing method capable of preventing occurrence of a crack can therefore enhance the reliability of the semiconductor element. Furthermore, since the manufacturing method can uniformly coat the antireflection film used at the time of forming the gate electrode, it can avoid overetching or incomplete etching in which a residue is left.

The invention is not limited to the above-described embodiment, but may be modified in various manners. For example, although the embodiment employs WSi as the material of the silicide layer, the material of the same may be TiSi, MoSi, CoSi, etc. Alternatively, a W layer, a Mo layer, a Co layer or a Ti layer may be used instead of the silicide layer.

Moreover, although in the embodiment, the second polysilicon layer is flattened by a single deposition treatment, the same advantage can be obtained even if the second polysilicon layer consists of plural polysilicon layers deposited by several deposition treatments, and any one of the polysilicon layers is flattened. Further, the second polysilicon layer may not completely be flattened. It suffices if no cracks will occur.

Although the embodiment employs a gas mixture of $CF_4$ and oxygen in the CDE treatment, too, the same advantage can be obtained even if a gas which contains fluorine, such as $NF_3$ or $C_2F_6$, etc., is used instead.

In addition, if at the time of flattening the second polysilicon layer, the etching is controlled such that even a thinnest portion of the layer has a thickness of 10 nm or more, the memory cell can be formed which is free from influence of the high-melting-point metal or silicide upon the insulating film.

Also, if D<L2 where L2 represents the difference in height between a concave portion and a convex portion of the deposited second polysilicon layer 109, and D the thickness of a thinnest portion of the layer 109, as shown in FIG. 4B, the reliability of the insulating film can be enhanced by increasing the amount of deposition of the second conductive (polysilicon) layer until the formula D>L2 is satisfied, and then flattening the upper surface such that the thinnest portion of the polysilicon layer 108 is not extremely overetched.

Furthermore, the trenches 106, formed in the first conductive layer 104 at locations corresponding to the element isolating layers 102 at the time of etching the layer 104 to form the floating gate, are considered as a main cause of the irregularities of the upper surface of the polysilicon layer 108 as the second conductive layer. If the second conductive layer (i.e. the polysilicon layer) 108 is deposited such that the formula L1>W/2 is satisfied (where W represents the width of the trench 106, and L1 the thickness of the second conductive layer 108), the upper surface portion of the second conductive layer is formed without being significantly influenced by the trench 106. Thus, the above-described manufacturing process can produce a highly reliable semiconductor memory device by controlling the thickness of the second conductive layer to the above value at the time of deposition thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor memory device, comprising the steps of:
   preparing a semiconductor substrate having an upper surface;
   forming a first insulating film on the semiconductor substrate;
   forming an element isolating layer on the semiconductor substrate for isolating element forming regions in the semiconductor substrate, the upper surface of the element isolating layer being located at a higher level than the upper surface of the semiconductor substrate;
   forming a first conductive layer on the first insulating film;
   forming a second insulating film on the element isolating layer and the first conductive layer;
   forming a second conductive layer on the second insulating film such that the second conductive layer has a substantially flat upper surface irrespective of the configuration of the element isolating layer and the first conductive layer thereby reducing thermal stress cracks due to subsequent thermal processing;
   forming a high-melting-point metal layer on the substantially flattened second conductive layer; and
   annealing the high-melting-point metal layer to make a silicide layer on the substantially flattened second conductive layer.

2. A method according to claim 1, wherein the upper surface of the second conductive layer is substantially flattened by a chemical dry etching.

3. A method according to claim 1, wherein the second conductive layer has a thickness of 100 nm or more.

4. A method according to claim 1, wherein the upper surface of the second conductive layer is located at substantially the same height from the surface of the semiconductor substrate.

5. A method according to claim 1, wherein a chemical dry etching using a gas containing fluorine is employed to substantially flatten convex portions of the upper surface of the second conductive layer.

6. A method according to claim 5, wherein the gas containing fluorine is a mixture gas of $CF_4$ and oxygen.

7. A method according to claim 5, wherein the gas containing fluorine is a mixture gas of $NF_3$ and oxygen.

8. A method according to claim 5, wherein the gas containing fluorine is a mixture gas of $C_2F_6$ and oxygen.

9. A method according to claim 1, wherein in depositing the second conductive layer, the amount of deposition of the second conductive layer is increased until formula $D>L2$ is satisfied, where D represents the thickness of a thinnest portion of the second conductive layer, and L2 represents the difference in height between the irregularities of the upper surface of the conductive layer.

10. A method of manufacturing a semiconductor memory devices comprising the steps of:
    preparing a semiconductor substrate;
    forming a first insulating film on the semiconductor substrate;
    forming an element isolating layer on the semiconductor substrate for isolating element forming regions in the semiconductor substrate, the upper surface of the element isolating layer being located at a higher level than the upper surface of the semiconductor substrate;
    forming a first conductive layer on the first insulating film;
    forming a second insulating film on the element isolating layers and the first conductive layer;
    forming a second conductive layer on the second insulating film such that the second conductive layer has a substantially flat upper surface irrespective of the configuration of the element isolating layer and the first conductive layer thereby reducing stress cracks due to subsequent thermal processing;
    forming a silicide layer on the substantially flattened second conductive layer; and
    annealing the silicide layer on the substantially flattened second conductive layer after the step of forming the silicide layer.

11. A method according to claim 10, wherein the second conductive layer has a thickness of 100 nm or more.

12. A method according to claim 10, wherein the upper surface of the second conductive layer is located at substantially the same height from the surface of the semiconductor substrate.

13. A method according to claim 10, wherein a chemical dry etching using a gas containing fluorine is employed to substantially flatten convex portions of the upper surface of the second conductive layer.

14. A method according to claim 13, wherein the gas containing fluorine is a mixture gas of $CF_4$ and oxygen.

15. A method according to claim 13, wherein the gas containing fluorine is a mixture gas of $NF_3$ and oxygen.

16. A method according to claim 13, wherein the gas containing fluorine is a mixture gas of $C_2F_6$ and oxygen.

17. A method according to claim 10, wherein in depositing the second conductive layer, the amount of deposition of the second conductive layer is increased until formula $D>L2$ is satisfied, where D represents the thickness of a thinnest portion of the second conductive layer, and L2 represents the difference in height between the irregularities of the upper surface of the conductive layer.

18. A method of manufacturing a semiconductor memory device, comprising the steps of:
    preparing a semiconductor substrate having an upper surface;
    forming a first insulating film on the semiconductor substrate;
    forming an element isolating layer on the semiconductor substrate for isolating element forming regions in the semiconductor substrate, the upper surface of the element isolating layer being located at a higher level than the upper surface of the semiconductor substrate;
    forming a first conductive layer on the first insulating film;
    forming a second insulating film on the element isolating layer and the first conductive layer;
    forming a second conductive layer on the second insulating film such that the second conductive layer has a substantially flat upper surface irrespective of the configuration of the element isolating layer and the first conductive layer thereby reducing thermal stress cracks due to subsequent thermal processing;
    forming a high-melting-point metal layer on the substantially flattened second conductive layer; and
    annealing the high-melting-point metal layer.

19. A method according to claim 18, wherein the second conductive layer has a thickness of 100 nm or more.

20. A method according to claim 18, wherein the upper surface of the second conductive layer is located at substantially the same height from the surface of the semiconductor substrate.

21. A method according to claim 18, wherein a chemical dry etching using a gas containing fluorine is employed to substantially flatten convex portions of the upper surface of the second conductive layer.

22. A method according to claim 21, wherein the gas containing fluorine is a mixture gas of $CF_4$ and oxygen.

23. A method according to claim 21, wherein the gas containing fluorine is a mixture gas of $NF_3$ and oxygen.

24. A method according to claim 21, wherein the gas containing fluorine is a mixture gas of $C_2F_6$ and oxygen.

25. A method according to claim 18, wherein in depositing the second conductive layer, the amount of deposition of the second conducive layer is increased until formula D>L2 is satisfied, where D represents the thickness of a thinnest portion of the second conductive layer, and L2 represents the difference in height between the irregularities of the upper surface of the conductive layer.

26. A method of manufacturing a semiconductor memory device, comprising the steps of:

preparing a semiconductor substrate having an upper surface;

forming a first insulating film on the semiconductor substrate;

forming an element isolating layer on the semiconductor substrate for isolating element forming regions in the semiconductor substrate, the upper surface of the element isolating layer being located at a higher level than the upper surface of the semiconductor substrate;

forming a first conductive layer on the first insulating film;

forming a second insulating film on the element isolating layer and the first conductive layer;

forming a second conductive layer on the second insulating film such that the second conductive layer has a substantially flat upper surface irrespective of the configuration of the element isolating layer and the first conductive layer thereby reducing thermal stress cracks due to subsequent thermal processing;

forming a high-melting point metal layer on the substantially flattened second conductive layer; and performing said thermal processing.

* * * * *